US006545922B2

(12) United States Patent
Nakazawa

(10) Patent No.: US 6,545,922 B2
(45) Date of Patent: Apr. 8, 2003

(54) SEMICONDUCTOR MEMORY DEVICE

(75) Inventor: Shigeyuki Nakazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/750,882

(22) Filed: Dec. 28, 2000

(65) Prior Publication Data

US 2001/0005334 A1 Jun. 28, 2001

(30) Foreign Application Priority Data

Dec. 28, 1999 (JP) .......................................... 11-372541

(51) Int. Cl.[7] ................................................ G11C 7/00
(52) U.S. Cl. ...................................... 365/203; 365/194
(58) Field of Search ............................. 365/203, 194, 365/233, 189.08

(56) References Cited

U.S. PATENT DOCUMENTS

| 5,689,470 A | * | 11/1997 | Inoue ........................ 365/203 |
| 5,892,722 A | * | 4/1999 | Jang et al. ................. 365/203 |
| 5,982,688 A | * | 11/1999 | Han ........................... 365/203 |
| 6,026,035 A | * | 2/2000 | Kim .......................... 365/203 |
| 6,147,916 A | * | 11/2000 | Ogura ....................... 365/203 |
| 6,205,069 B1 | * | 3/2001 | Kim .......................... 365/203 |
| 6,337,822 B1 | * | 1/2002 | Kwak et al. ............... 365/203 |
| 6,351,422 B2 | * | 2/2002 | Rohr et al. ................ 365/203 |
| 6,366,512 B1 | * | 4/2002 | Yeh et al. .................. 365/203 |

FOREIGN PATENT DOCUMENTS

| JP | 4-349296 | 12/1992 |
| JP | 2000-231791 | 8/2000 |

* cited by examiner

Primary Examiner—Trong Phan
(74) Attorney, Agent, or Firm—Katten, Muchin, Zavis, Rosenman

(57) ABSTRACT

A memory cell array is provided to a semiconductor memory device, and a plurality of memory cells composes a column in the memory cell array. The plurality of memory cells are commonly connected to a plurality of bit line pairs. The plurality of bit line pairs are commonly connected to an I/O line pair. A pre-charge circuit is also provided to the semiconductor memory device. The pre-charge circuit pre-charges the I/O line pair. The pre-charge circuit has a selection circuit within selects a pre-charge level of the I/O line pair from among a plurality of voltage levels.

11 Claims, 11 Drawing Sheets

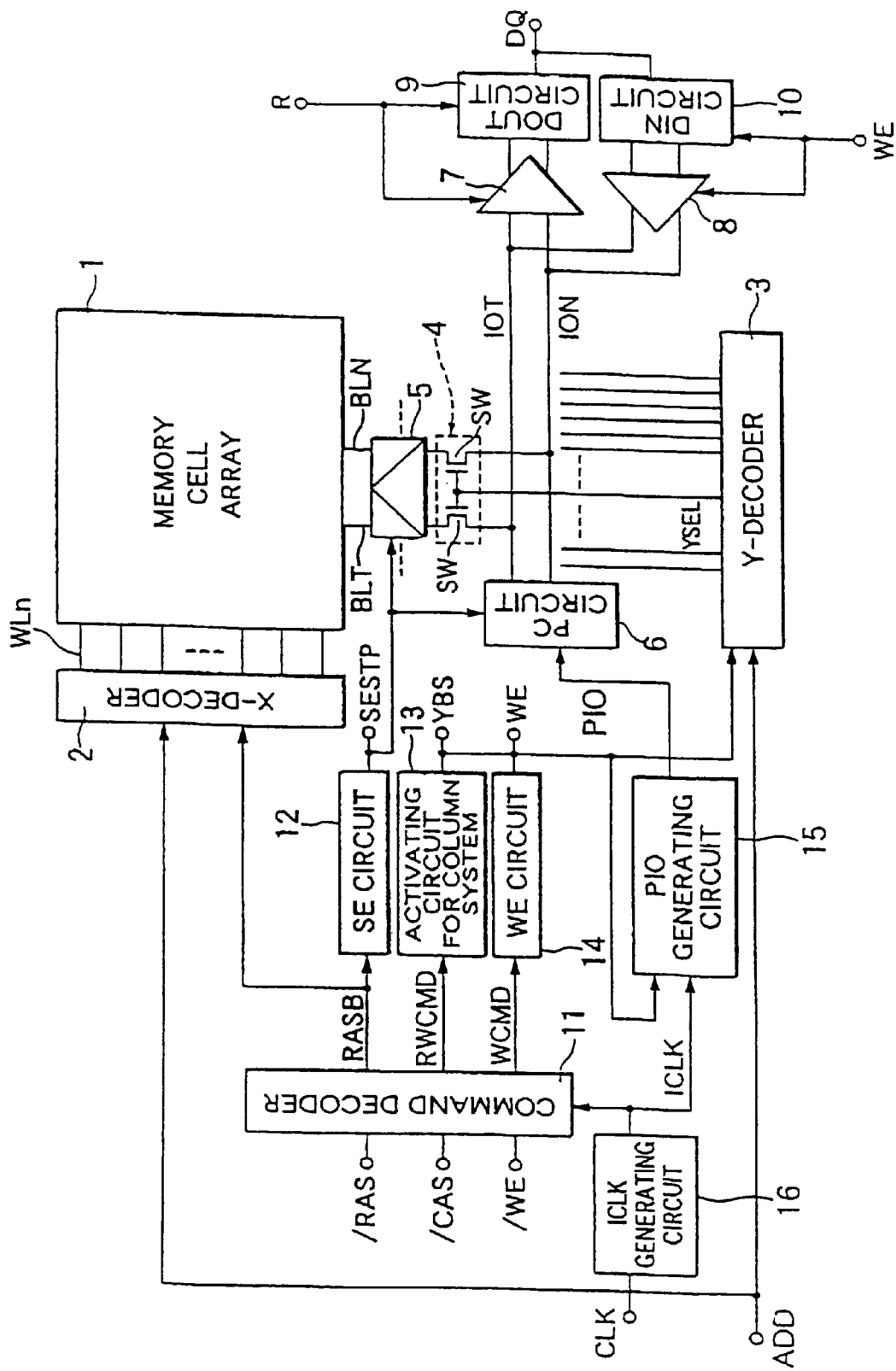

SEMICONDUCTOR MEMORY DEVICE

BACKGROUND OF THE INVENTION

1. Field of the Invention

The present invention relates to a semiconductor memory device such as a dynamic random access memory, and particularly it relates to a semiconductor memory device with an accelerated operating speed.

2. Description of the Related Art

Conventional semiconductor memory devices such as a synchronous dynamic random access memory (SDRAM) are generally provided with a pre-charge circuit for pre-charging of I/O lines to which a plurality of bit lines pairs connected to memory cells are connected via a column selecting circuit. The pre-charge circuit used here adjusts the I/O lines to a prescribed potential for reading and writing of data, and it accelerates data reading and writing while preventing write and read errors. FIG. 1 is a circuit diagram of a pre-charge circuit in a conventional semiconductor memory device.

In the pre-charge circuit 101 of a conventional semiconductor memory device there are provided two P-channel transistors Tr101a and Tr101b with their drains connected to I/O lines IOT and ION, respectively. A constant voltage Vc is supplied to the sources of the transistors Tr101a and Tr101b, and a pre-charge control signal PIO is supplied to each gate. During pre-charge, both the transistors Tr101a and Tr101b are switched on, and the potentials of the I/O lines IOT and ION become the constant voltage Vc. A design includes an equalizing transistor provided in the pre-charge circuit, with the two I/O lines IOT and ION short-circuited by the equalizing transistor during pre-charge, and adjusted to be at the same potential (balance level).

Operation of a conventional semiconductor device with a pre-charge circuit having that construction will now be explained. FIG. 2A and FIG. 2B are schematics showing the operation of a conventional semiconductor memory device, where FIG. 2A is a timing chart for a case where the constant voltage Vc, i.e. balance level (Vcc/2<Vc1 (=Vc)<Vcc) is high (hereinafter, first prior art), and FIG. 2B is a timing charge for a case where the constant voltage Vc2 is ½ of the power voltage Vcc (hereinafter, second prior art). Here, the voltage Vcc is a power voltage supplied to the I/O circuit (not shown) connected to the pre-charge circuit. "Balance level" refers to a potential supplied to the I/O lines IOT and ION through each of the transistors Tr101a and Tr101b, or a potential of the I/O lines IOT and ION that converge when the two I/O lines IOT and ION are short-circuited by the equalizing transistor (not shown).

As shown in FIG. 2A, when the constant voltage Vc is set to satisfy Vcc/2<Vc1<Vcc (first prior art), the pre-charge control signal PIO is high during pre-charge before writing and reading, and the I/O lines IOT and ION are pre-charged to the voltage Vc1.

Next, when the pre-charge control signal PIO falls to begin writing or reading, the potential of the I/O lines IOT and ION is dragged to the potential of the bit line pairs connected to the memory cells composing a column selected by an address signal. As a result, the potential of the I/O line IOT increases (or decreases) and the potential of the I/O line ION decreases (or increases) in response to the read/written data. That is, a signal fed to the I/O line IOT and a signal fed to the I/O line ION are in a complementary relationship. If the operation at that time is data writing, a written signal is amplified by a write amplifier (not shown), and therefore the increase and decrease of each potential is large. Then, the potential of one I/O line converges to the internal power voltage Vcc, and the potential of the other I/O line converges to the ground potential GND.

On the other hand, if the operation is data reading, bit lines pairs of a DRAM are normally pre-charged to Vcc/2, and immediately after reading the bit line pairs undergo spreading of a potential difference centered on Vcc/2 in response to the read data. However, since amplification by a sense amplifier (not shown) of the differential potential between the bit line pairs is insufficient, the difference between the potential of one bit line pair and the potential of the I/O line IOT (or ION) is small and the increase (or decrease) of the potential of the I/O line IOT (or ION) is small. In contrast, since the voltage Vc1 at the pre-charge level is higher than Vcc/2, the difference between the potential of the other bit line and the potential of the I/O line ION (or IOT) is large. Therefore, the potential of the I/O line ION (or IOT) undergoes a large decrease (or increase). It is therefore possible to obtain a sufficient differential potential for the I/O lines IOT and ION. This is because the relationship between the voltage between the gate-source and the drain current is a square relationship, and therefore a large potential difference between the gate-source results in a greater change in the drain current.

When the pre-charge control signal PIO rises next, the I/O lines IOT and ION are pre-charged to voltage Vc1. The data writing and reading and the pre-charging are then carried out alternately in synchronization with the rise and fall of the pre-charge control signal PIO. Upon completion of reading and writing, the pre-charge control signal PIO is fixed high.

On the other hand, when the constant voltage Vc is set to the voltage Vc2 which is Vcc/2, as shown in FIG. 2B (second prior art), the pre-charge control signal PIO is high during pre-charge before writing and reading, and the IO lines IOT and ION are pre-charged to the voltage Vc2.

Next, when the pre-charge control signal PIO falls to begin writing or reading, the potential of the I/O lines IOT and ION is dragged to the potential of the bit line pairs connected to the memory cells composing a column selected by an address signal. As a result, the potential of the I/O line IOT increases (or decreases) and the potential of the I/O line ION decreases (or increases) in response to the read/write data. If the operation at that time is data writing, a written signal is amplified by the write amplifier (not shown), and therefore the increase and decrease of each potential is large. Then, the potential of one I/O line IOT or ION converges to the internal power voltage Vcc, and the potential of the other I/O line ION or IOT coverages to the ground potential GND. On the other hand, if the operation is data reading, the sense amplification by the sense amplifier (not shown) of the differential potential between the bit line pairs is insufficient, the difference between the potential of both bit lines and the potential of the I/O lines IOT and ION is small and the increase of the potential of the I/O lines IOT and ION is small.

When the pre-charge control signal PIO rises next, the I/O lines IOT and ION are pre-charged to voltage Vc2. At this time, since the pre-charge level is set to Vcc/2, the potential of the I/O lines IOT and ION rapidly reaches the voltage Vc2. The data writing and reading and the pre-charging are then carried out alternately in synchronization with the rise and fall of the pre-charge control signal PIO. Upon completion of reading and writing, the pre-charge control signal PIO is fixed high.

However, in the semiconductor memory device of the first prior are explained above, the constant voltage Vc is set to the voltage Vc1 (Vcc/2<Vc1<Vcc), and therefore upon pre-charging of the I/O line IOT or ION switched to the GND side immediately after a wiring operation, time is required to restore it to the pre-charge level Vc1. Because of the long restoration time tb, the period of activation of the pre-charge control signal PIO (the high period in FIG. 2A) must be set longer, and thus the time for a single cycle tck for the pre-charge control signal PIO must be set longer.

Conversely, as in second prior art, the problem when the constant voltage Vc is set to voltage Vc2 (Vcc/2) is as follows. When a row address is sent from the outside to the semiconductor memory device, one word line is activated and data stored in a memory cell is outputted via a bit line pair. The sense amplifier amplifies the differential potential of the bit line pair, and discerns the memory data while outputting the discernment results to the I/O line.

However, when amplification by the sense amplifier immediately after the start of reading is insufficient, there is substantially no differential potential between the bit line and the I/O line IOT or ION, so that the differential potential ΔV produced between the I/O line IOT and the I/O line ION is extremely small. In the case of successive reading of multiple memory cells connected to one word line, such as burst reading, the differential potential ΔV of the initially read data is the smallest, while the differential potential ΔV increases with subsequent data. An output buffer begins reading while the differential potential ΔV is extremely small, and this may inhibit the normal reading operation.

The problem is that, in order to prevent this situation, it is necessary to lengthen the time from initial sensing to initial reading, i.e. the time from input of the row address strobe signal (RAS) until input of the column address strobe signal (CAS) ($t_{RCD}$: RAS-to-CAS delay), so that output of the sense amplifier can sufficiently amplify the reading data. This has resulted in the problem of a longer time from access of the semiconductor memory device until read out of the data (access time).

Specifically, while the first prior art has the problem of a longer continuous writing time, it allows shortening of the initial reading time. Conversely, the second prior art has the problem of a longer initial reading time, but allows shortening of the continuous writing time.

In a conventional semiconductor memory device, therefore, product specifications have been designed to favor one property while sacrificing the other property. That is, the pre-charge level has been selected and set by either favoring the initial reading time or favoring the continuous writing time. Hence, it has not been possible to shorten both of these times simultaneously. Even with an accelerated clock signal, the speed cannot be fully reached.

SUMMARY OF THE INVENTION

It is an object of the present invention to provide a semiconductor memory device that can shorten both the pre-charge control signal cycle and the time from the initial sensing to the first reading or writing.

A semiconductor memory device according to the present invention comprises a memory cell array, a plurality of bit line pairs to which a plurality of memory cells are commonly connected, an I/O line pair to which the plurality of bit line pairs are commonly connected, and a pre-charge circuit which pre-charges the I/O line pair. The plurality of memory cells compose a column in the memory cell array. The pre-charge circuit has a selection circuit which selects a pre-charge level of the I/O line pair from among a plurality of voltage levels.

The selection circuit may set a pre-charge level after a plurality of memory cells are selected up until the initial writing or reading is conducted to a first level, the plurality of memory cells composing a row in the memory cell array of the semiconductor memory device and data writing or reading being performed in the plurality of memory cells. The selection circuit may then set a precharge level after completion of data writing up until the next data writing or reading to a second level.

In the semiconductor memory device according to the present invention a value obtained by the expression |Va-Vbal| may be larger than a value obtained by the expression |Vb-Vbal|, where Va is the first level, Vb is the second level and Vbal is a balance of a differential potential between the I/O line pair at the time of data writing.

In the semiconductor memory device according to the present invention the first level Va may be equivalent to the balance potential Vbal and the second level may be half a voltage supplied to an internal circuit.

The first level may be a voltage obtained by stepping down a voltage supplied to an internal circuit.

The selection circuit may set the pre-charge level to the second level after completion of the second or later data writing or reading after the plurality of memory cells are selected.

According to the present invention, a selection circuit which selects a pre-charge level for the I/O line pair among a plurality of voltage levels is provided in the pre-charge circuit, so that the pre-charge level can be switched during the initial data reading and after data reading. That is, during the initial data reading, the pre-charge level of the I/O line pair is selected by the selection circuit to one with a large difference from the potential of one bit line, thus allowing a large differential potential to be obtained for the I/O line pair. Consequently, if the differential potential of the I/O line pair during the initial data reading is larger and the pre-charge level after data reading is set to allow a balance to be easily achieved, this can be followed even when the clock signal is accelerated. Furthermore, if after data reading the selection circuit sets the pre-charge level of the I/O line pair to be at or near the balance of the differential potential between the I/O line pair at the time of data writing, for example, it is possible to rapidly achieve a balance after the data writing. It is thereby possible to reducing the operating current compared to conventional devices in which the pre-charge level is always set high.

BRIEF DESCRIPTION OF THE DRAWINGS

FIG. 3 is a block diagram of structure of a semiconductor memory device according to a first embodiment of the present invention.

THE PREFERRED EMBODIMENT OF THE INVENTION

Figure 1:
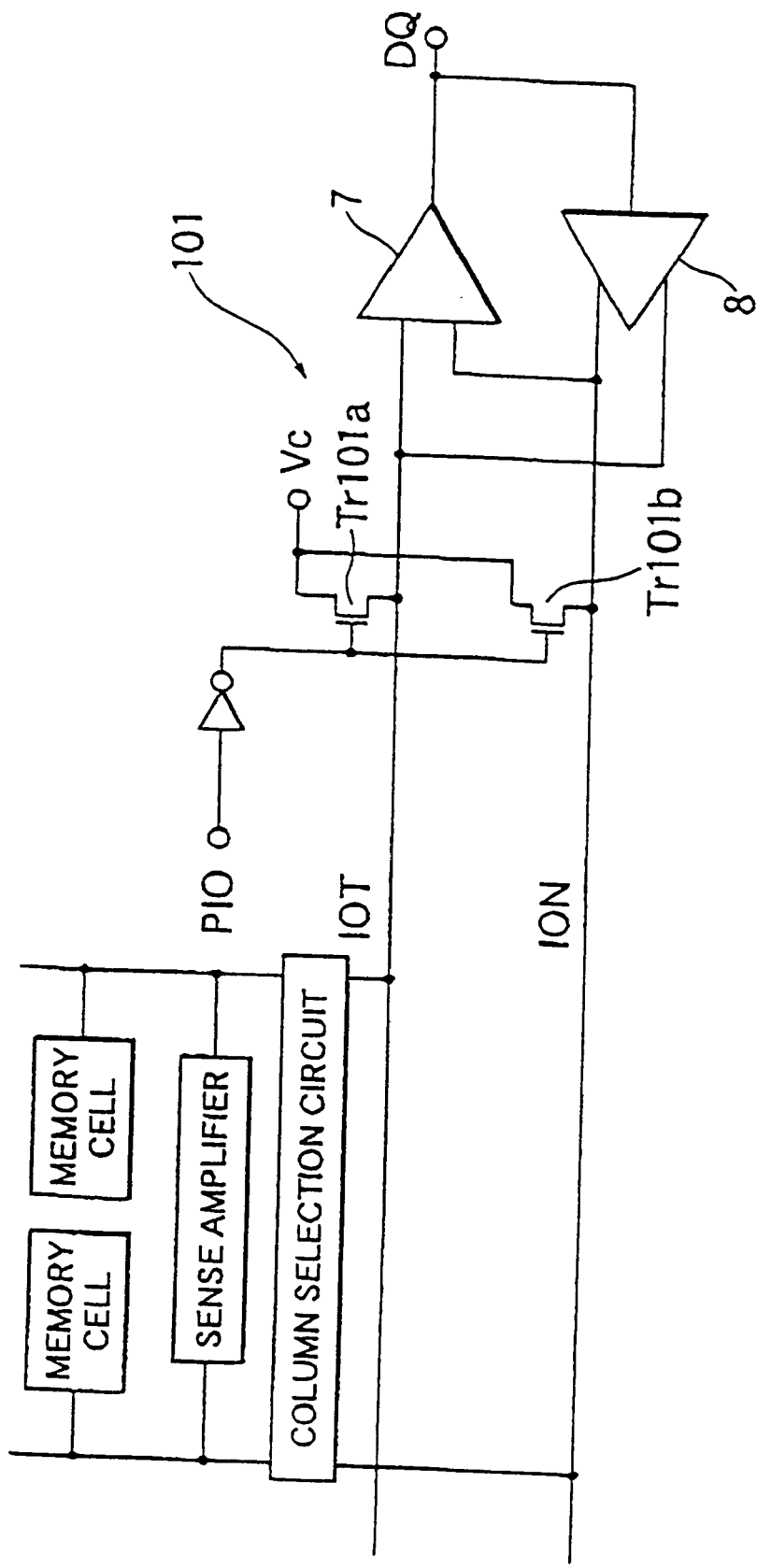
FIG. 1 is a circuit diagram of a pre-charge circuit in a conventional semiconductor memory device.
Figure 2A:
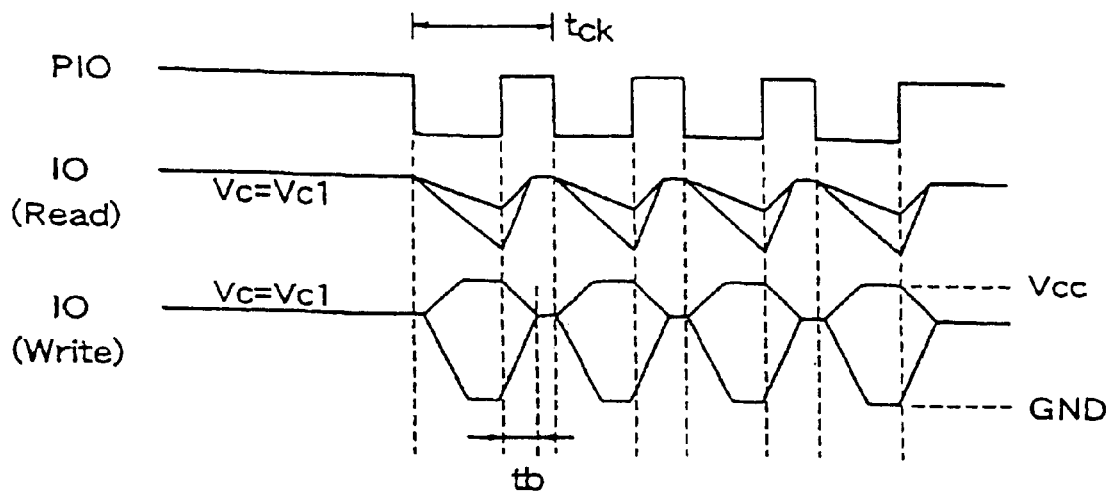
FIG. 2A and FIG. 2B are timing charts showing operation of conventional semiconductor memory devices.
Figure 2B:
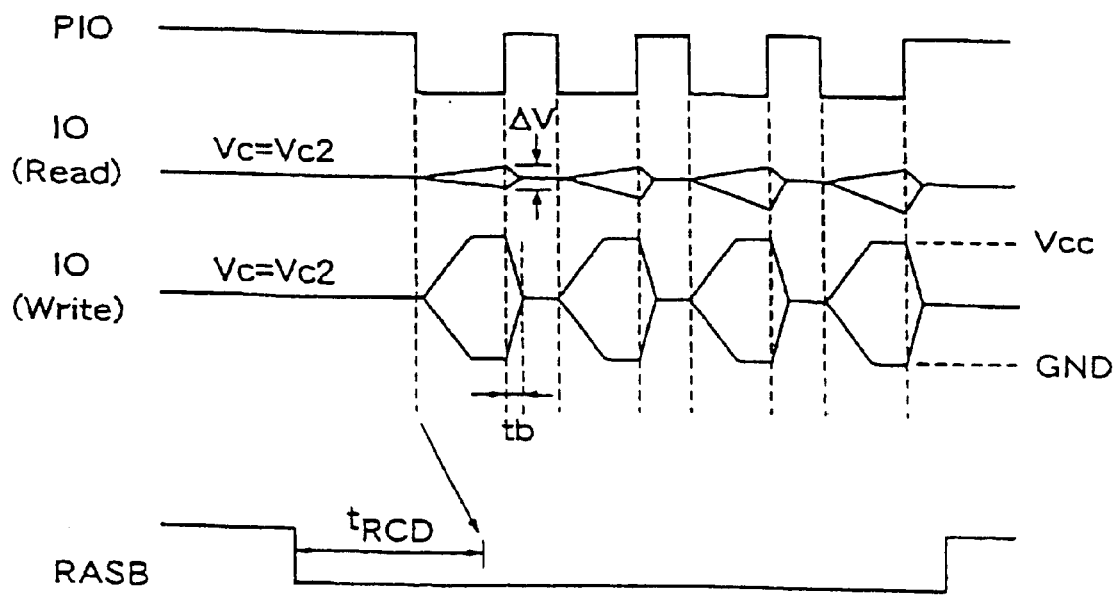

Preferred embodiments of the invention will now be explained in detail with reference to the attached drawings. FIG. 3 is a block diagram of structure of a semiconductor memory device according to a first embodiment of the invention.

The first embodiment is provided with a memory cell array 1 with memory cells arranged in a matrix fashion. An address signal ADD which indicates read address or write address of the memory cell array 1 is input to an X-decoder 2 and Y-decoder 3 that decode input row address and input column address, respectively. A column selecting circuit 4 is connected to the Y-decoder 3. Bit line pairs comprising bit lines BLT and BLN are connected to each memory cell column composing the memory cell array 1, and one sense amplifier 5 is provided on each bit line pair. The plurality of bit lines BLT composing each bit line pair are commonly connected to an I/O line IOT via the column selecting circuit 4. The plurality of bit lines BLN composing each bit line pair are commonly connected to an I/O line ION via the column selecting circuit 4. The I/O lines IOT and ION compose a signal line pair which is in a complementary relationship. Switches SW each comprising a transistor are connected between the each bit line BLT and I/O line IOT and between each bit line BLN and I/O line ION as part of the column selecting circuit 4. Two transistor gates are commonly connected to the switches SW of each bit line pair. The potential at the common connection of each is controlled by a selection signal YSEL output from the Y decoder 3.

A pre-charge (PC) circuit 6 is connected to the ends of the I/O lines IOT and ION, and a data amplifier 7 and a write amplifier 8 are connected in mutual parallel to the other ends. A data output (DOUT) circuit 9 is connected to the data amplifier 7, and a data input (DIN) circuit 10 is connected to the write amplifier 8. The data output circuit 9 and the data input circuit 10 are commonly connected to a terminal DQ.

The first embodiment further has a command decoder 11 provided with the terminals to which in control signal /RAS, a /CAS and a /WE are inputted from the outside. The command decoder outputs a word line selection signal RASB, a read/write control signal RWCMD and a write control signal WCMD in synchronization with the rise of a clock signal CLK.

The read/write control signal RWCMD is a signal that changes from a low level to a high level when the control signal /CAS input to the command decoder 11 changes to a low level. The read/write control signal RWCMD is inputted to the data amplifier 7, the write amplifier 8, the DOUT circuit 9, and the DIN circuit 10.

The write control signal WCMD changes from a low level to a high level when the control signal /CAS and the control signal /WE input to the command decoder 11 changes to a low level.

The word line selection signal RASB is a signal that changes from a high level to a low level when the row address is incorporated, and changes from a low level to a high level when a series of reading or writing operations have been completed. A derived signal of the word line selection signal RASB is inputted to the X-decoder 2, and one word line is activated in the memory cell array 1 based on its change.

There are also provided a sense enable (SE) circuit 12 which inputs the word line selection signal RASB and outputs a sense-indicating signal SESTP, an activating circuit for column-system 13 which inputs the read/write control signal RWCMD and outputs a column-activating signal YES, and a write enable (WE) circuit 14 which inputs the write control signal WCMD and outputs a write enable signal WE.

The sense-indicating signal SESTP is a delayed signal of a sense amplifier activating signal (not shown) which is a delayed signal of the word line selection signal RASB, and it is inputted only to the pre-charge circuit 6. The sense amplifier activating signal is a signal which is inputted to the sense amplifier SA and is converted to a high level to activate the sense amplifier 5.

The column-activating signal YES is a signal which is inputted to circuits which belong column-system (column circuits) and is converted to a high level to activate the column circuits. Here, the column circuits includes, for example, the y-decoder 3, the column selection circuits 4, the data amplifier 7 and the write amplifier 8. The column-activating signal YBS is also used to generate a pre-charge control signal PIO described below.

The write enable signal WE is a signal which is inputted to the write amplifier 8 and the DIN circuit 10, and is converted to a high level to activate the write amplifier 8 and the DIN circuit 10 during data writing. If the write enable signal WE becomes at a high level when the read/write control signal RWCMD is also at a high level, the write amplifier 8 and the DIN circuit 10 are activated and data is written to the memory cell array 1. If the write enable signal WE is at a low level when the read/write control signal RWCMD is at a high level, the data amplifier 7 and the DOUT circuit 9 are activated and data is read from the memory cell array 1.

According to the present embodiment, the pre-charge control signal PIO, which controls I/O lines IOT and ION, and the sense-indicating signal SESTP are inputted to the pre-charge circuit 6.

The pre-charge control signal PIO is a signal produced by the PIO generating circuit that inputs an internal clock signal ICLK from an ICLK production circuit 16 and inputs the aforementioned column-activating signal YBS. The pre-charge control signal PIO is a signal that controls the timing of pre-charge of the I/O lines IOT and ION.

Figure 4:
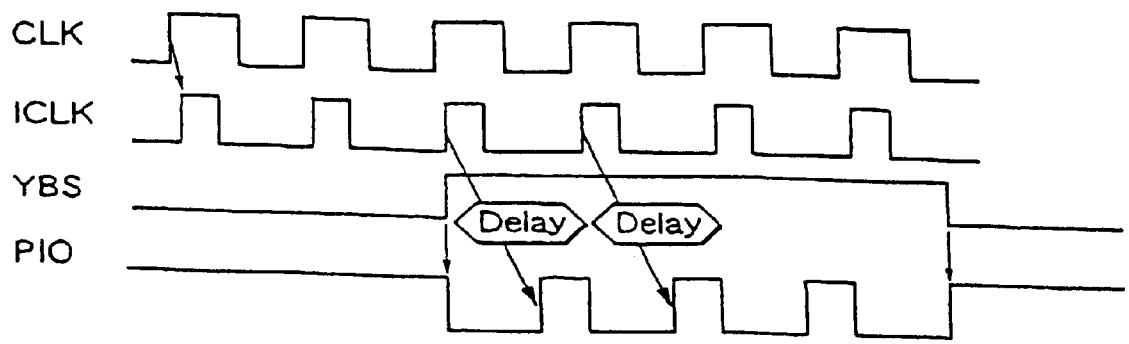
FIG. 4 is a timing chart showing generation of a pre-charge control signal PIO in a PIO generating circuit.

FIG. 4 is a timing chart showing generation of the pre-charge control signal PIO by the PIO generating circuit.

The internal clock signal ICLK is generated at a delay to the clock signal CLK, and the pre-charge control signal PIO falls in synchronization with the rise of the column-activating signal YBS. The pre-charge control signal PIO switches the high level and low level as a delay signal of the internal clock signal ICLK.

Figure 5:
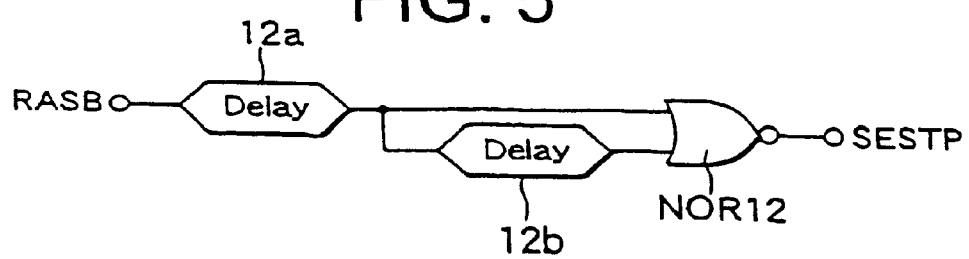
FIG. 5 is a block diagram of construction of a sense enable (SE) circuit 12 according to the first embodiment.

FIG. 5 is a block diagram of structure of a sense enable (SE) circuit 12 according to the first embodiment. The sense enable circuit 12 is provided with a delay circuit 12a and a delay circuit 12b. The input end of the delay circuit 12a is connected to an input terminal which inputs the word line selection signal RASB. The input end of the delay circuit 12b is connected to the output terminal of the delay circuit 12a. It is also provided with a NOR gate NOR12 which takes the NOR logic of the output signals of the delay circuits 12a and 12b. The output signal of the NOR gate NOR12 is the sense-indicating signal SESTP. The aforementioned sense amplifier activating signal is produced as the output signal of the delay circuit 12a, for example.

The delay time by the delay circuits 12a and 12b is set so that the time from fall of the word line selection signal RASB until rise of the sense-indicating signal SESTP is longer than the time from fall of the word line selection signal RASB until the initial fall of the pre-charge control signal PIO, and shorter than the time until the next rise of the pre-charge control signal PIO. In the sense enable circuit 12, the delay circuits 12a and 12b are set so that the sense-indicating signal SESTP reacts late to the fall of the word line selection signal RASB, and reacts relatively early to the rise of the word line selection signal RASB.

Figure 6:
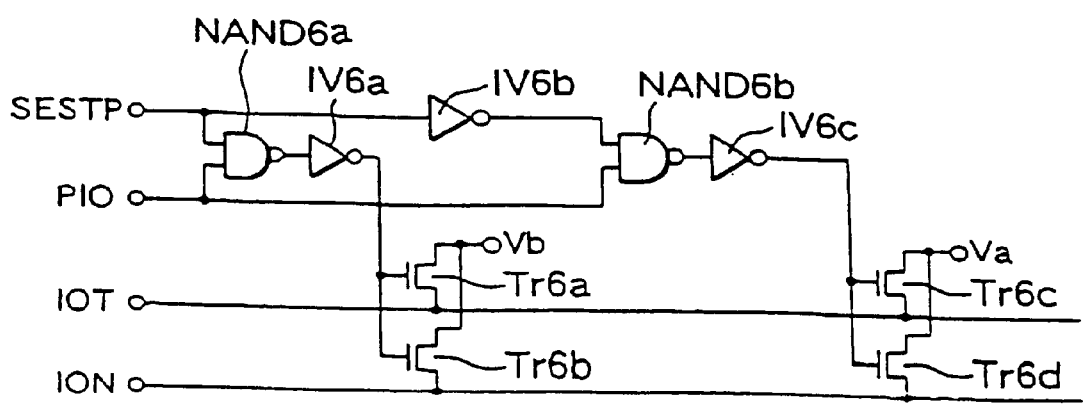
FIG. 6 is a block diagram showing a pre-charge (PC) circuit 6 and I/O lines IOT and ION according to the first embodiment.

FIG. 6 is a block diagram showing a pre-charge circuit 6 and I/O lines IOT and ION for the first embodiment. In the pre-charge circuit 6, there are provided a NAND gate NAND6a that takes a NAND logic of the pre-charge control signal PIO and the sense-indicating signal SESTP, and a inverter IV6a that inverts the output signal of the NAND gate NAND6a. It is also provided with an inverter IV6b, a NAND gate NAND6b, and an inverter IV6c. The inverter IV6b inverts the sense-indicating signal SESTP. The NAND gate NAND6b takes the NAND logic of the output signal of the inverter IV6b and the pre-charge control signal PIO. The inverter IV6c inverts the output signal of the NAND gate NAND6b.

The pre-charge circuit 6 is further provided with P-channel transistors Tr6a and Tr6b to whose gates the output signal of the inverter IV6a is supplied. A voltage Vb is supplied to the sources of the transistors Tr6a and Tr6b, and their drains are connected to the I/O lines IOT and ION, respectively. There are also provided P-channel transistors Tr6c and Tr6d to whose gates the output signal of the inverter IV6c is supplied. A voltage Va is supplied to the sources of the transistors Tr6c and Tr6d, and their drains are connected to the I/O lines IOT and ION, respectively. The voltage Vb is an average voltage (balance level) Vba1 of the amplitude during reading data from the memory cell, and the voltage Va is a higher voltage than the voltage Vb; for example, it is a voltage supplied to the memory cell array 1 and/or the internal circuit of the sense amplifier 5, which may have been stepped down in a step-down circuit (not shown).

Figure 7:
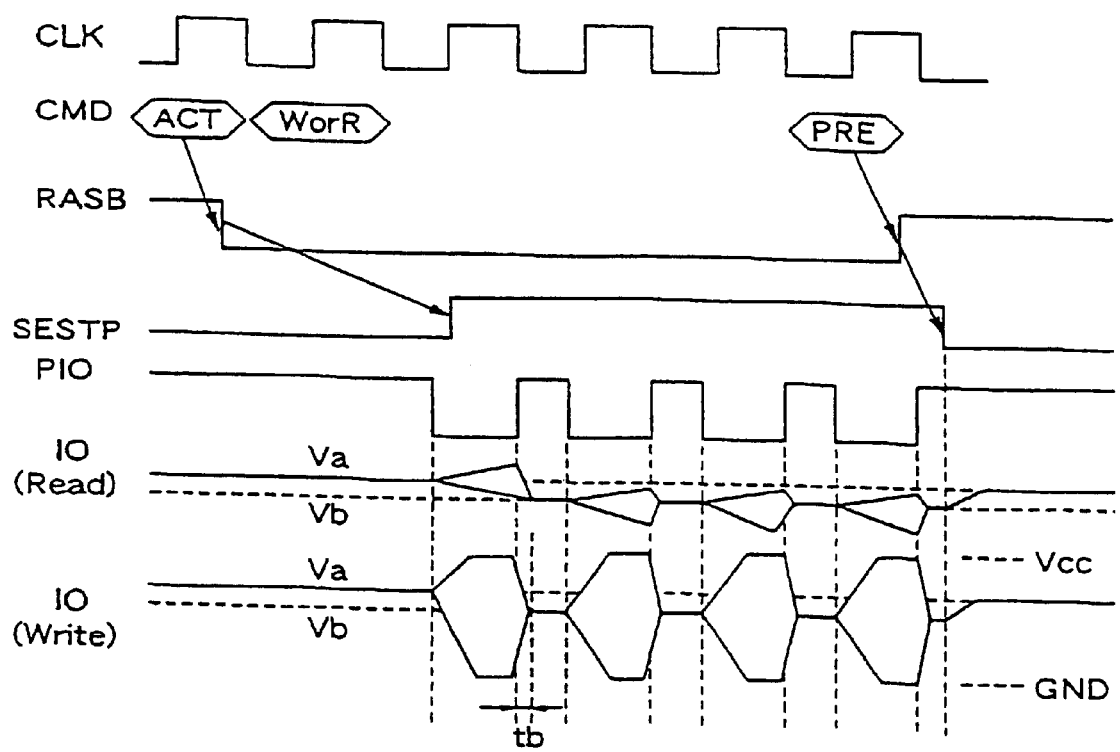
FIG. 7 is a timing chart showing operation of a semiconductor memory device according to the first embodiment of the present invention.

The operation of the first embodiment having the structure described above will now be explained. FIG. 7 is a timing chart showing operation of a semiconductor memory device according to the first embodiment of the present invention. FIG. 7 shows IO (Read) and IO (Write) separately, but this is only to highlight the voltage change when each operation alone is carried out continuously, and the reading operation and writing operation may be combined. In FIG. 7 the reading and writing are shown in the same diagram, but it need not be mentioned that reading and writing operations cannot be carried out simultaneously. Also, the operation described below is the operation performed after memory cells are selected among the memory cell array 1, the memory cells being to compose one row and in which data writing and reading being to be performed; i.e., after selection of the word line, until completion of the continuous data reading of writing operation. The change of the signals RASB, RWCMD, WCMD, SESTP, YBS and WE are common to the first embodiment and to the second and third embodiments explained later, and therefore the changes in the signals RWCMD, WCMD, YBS and WE will be explained in detail below.

If the control signal /RAS is low, the control signal /CAS is high and the control signal /WE is high when the clock signal CLK rises, the command decoder 11 decodes these signals, outputs an action command ACT, and lowers the word line selection signal RASB at a delay. At this timing, since the sense-indicating signal SESTP is low, the transistors Tr6a and Tr6b are in an OFF state while the transistors Tr6c and Tr6d are in an ON state, and the I/O lines IOT and ION are pre-charged to the voltage Va.

Subsequently, if the control signal /RAS is high, the control signal /CAS is low and the control signal /WE is low when the clock signal CLK rises, the command decoder 11 outputs a write command W. If the control signal /RAS is high, the control signal /CAS is low and the control signal /WE is high when the clock signal CLK rises, the command decoder 11 outputs a read command R.

Next, when the pre-charge control signal PIO falls, the potentials of the I/O lines IOT and ION are dragged to the potentials of the bit line pairs BLT and BLN connected to the memory cells composing a selected column from each column selecting circuit 4. As a result, the potential of the I/O line IOT may increase and the potential of the I/O line ION may decrease. If the operation at this time is writing of data to the selected memory call, a written signal is amplified by the write amplifier 8, and therefore the increase or decrease of each potential is large. Therefore the potential of the I/O line IOT converges to the internal power voltage Vcc while the potential of the I/O line ION converges to the ground potential GND. On the other hand, when the operation is reading of data from the selected memory cell, the amplification of the differential potential of the bit line pair by the sense amplifier 5 is insufficient and therefore the difference between the potential of the bit line BLT and the potential of the I/O line IOT is small. Thus, the increase in the potential of the I/O line IOT is small. According to the embodiment, however, the voltage Va which is at the pre-charge level is higher than the balance level Vbal, and therefore the difference between the potential of the bit line BLT and the potential of the I/O line IOT is large and the potential of the I/O line ION falls considerably, thus resulting in a sufficient differential potential between the I/O lines IOT and ION.

The sense-indicating signal SESTP rises during the first reading data from the memory cell or writing data to the memory cell. Thus, when the pre-charge control signal PIO subsequently rises, the transistors Tr6a and Tr6b are in an ON state while the transistors Tr6c and Tr6d are in an OFF state. As a result, the I/O lines IOT and ION are pre-charged to the voltage Vb (balance voltage Vbal). Consequently, even when the operation prior to pre-charging was a writing operation, the potential of the I/O lines IOT and ION quickly reaches the voltage Vb (balance voltage Vbal).

Next, data writing and reading are carried out alternately with pre-charging, in synchronization with the rise and fall of the pre-charge control signal PIO.

When the control signal /RAS is inputted low, the control signal /CAS is high and the control signal /WE is low when the clock signal CLK rises, the command decoder 11 outputs a pre-charge command PRE, and the word line selection signal RASB rises after a delay. When this occurs, the selected word line is restored to the OFF state, and connection between the memory cell and the bit line is cut. The pre-charge control signal PIO is then fixed high in synchronization with the fall of the clock signal CLK, and read/write is complete. At a fixed delay after rise of the word line selection signal RASB, the sense-indicating signal SESTP falls and the I/O lines IOT and ION are pre-charged to the voltage Va.

Thus, according to the present embodiment, the pre-charge level of the I/O lines IOT and ION just before the initial fall of the pre-charge control signal PIO is set to the voltage Va, and it is therefore possible for the differential potential between the I/O lines IOT and ION to be increased to a readable level even when the differential potential of the bit line pair is not sufficiently amplified by the sense amplifier 5. Furthermore, since the pre-charge level of the I/O lines IOT and ION is changed to the voltage Vb, which is the balance level Vbal, with the rise of the sense-indicating signal SESTP up until the subsequent rise of the initial pre-charge control signal PIO, the time tb up to the pre-charge immediately thereafter is extremely short even if writing data is to be performed next. Consequently, it is possible to shorten the time $t_{RCP}$ from the initial sensing by the sense amplifier 5 until the fall of the pre-charge control signal PIO, while also shortening the time tb to a balance during continuous writing to shorten one cycle $t_{ck}$ of the pre-charge control signal PIO. This can therefore be applied for acceleration of the clock signal CLK.

The balance is easier to achieve after writing compared to a conventional semiconductor memory device in which the pre-charge level is always set high, and therefore the operating current can also be reduced.

Figure 8:
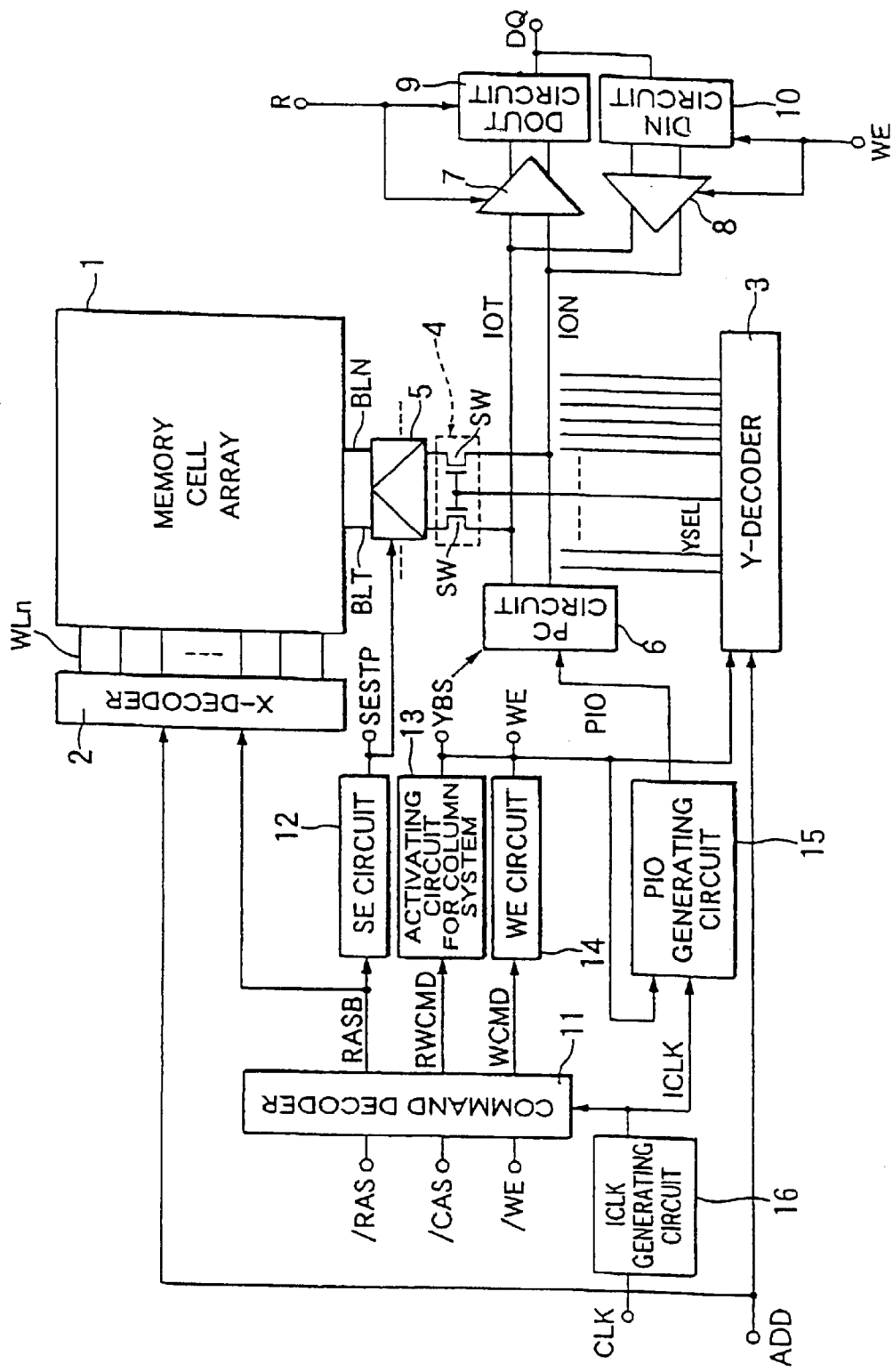
FIG. 8 is a block diagram of structure of a semiconductor memory device according to a second embodiment of the present invention.
Figure 9:
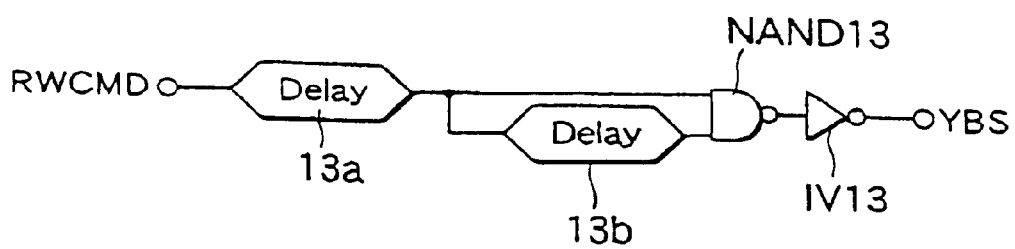
FIG. 9 is a block diagram of structure of an activating circuit for column-system 13 according to the second embodiment.
Figure 10:
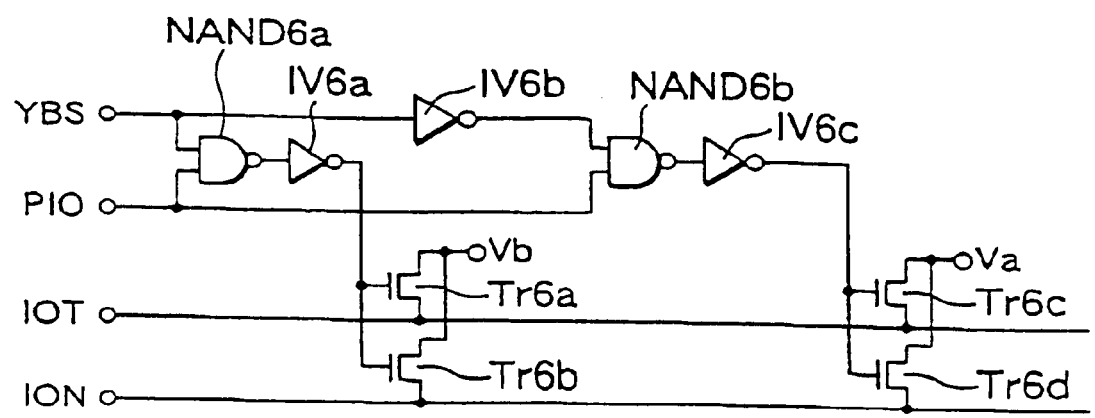
FIG. 10 is a block diagram showing a pre-charge (PC) circuit 6 and I/O lines IOT and ION according to the second embodiment.

A second embodiment of the present invention will now be explained. According to the second embodiment, the column-activating signal YBS is inputted to the pre-charge circuit 6 instead of the sense-indicating signal SESTP. FIG. 8 is a block diagram of structure of a semiconductor memory device according to a second embodiment of the present invention. FIG. 9 is a block diagram of structure of an activating circuit for column-system 13 according to the second embodiment. FIG. 10 is a block diagram showing a pre-charge circuit 6 and I/O lines IOT and ION according to the second embodiment.

According to the second embodiment, the activating circuit for column-system 13 is provided with a delay circuit 13a and a delay circuit 13b. The input end of the delay circuit 13a is connected to an input terminal which inputs the read/write control signal RWCMD. The input end of the delay circuit 13b is connected to the output terminal of the delay circuit 13a. There are also provided a NAND gate NAND13 and an inverter IV13. The NAND gate NAND13 takes a NAND logic of the output signals of the delay circuits 13a and 13b. The inverter IV13 inverts the output signal of the NAND gate NAND13. The output signal of the inverter IV13 is the column-activating signal YBS.

As shown in FIG. 8 and FIG. 10, the pre-charge circuit 6 has the same construction as the first embodiment except that the column-activating signal YBS, and not the sense-indicating signal SESTP, is inputted.

The delay time by the delay circuits 13a and 13b is set so that the time from rise of the read/write control signal RWCMD until rise of the column-activating signal YES is longer than the time from rise of the read/write control signal RWCMD until the initial fall of the pre-charge control signal PIO, and shorter than the time until the next rise of the pre-charge control signal PIO. In the column activating circuit 13, the delay circuits 13a and 13b are set so that the column-activating signal YBS reacts late to the rise of the read/write control signal RWCMD, and reacts relatively early to the fall of the read/write control signal RWCMD. However, the delay time of the column-activating signal YBS from the rise of the read/write control signal RWCMD is set to be a smaller delay time than that of the sense-indicating signal SESTP from the fall of the word line selection signal RASB in the first embodiment.

Figure 11:
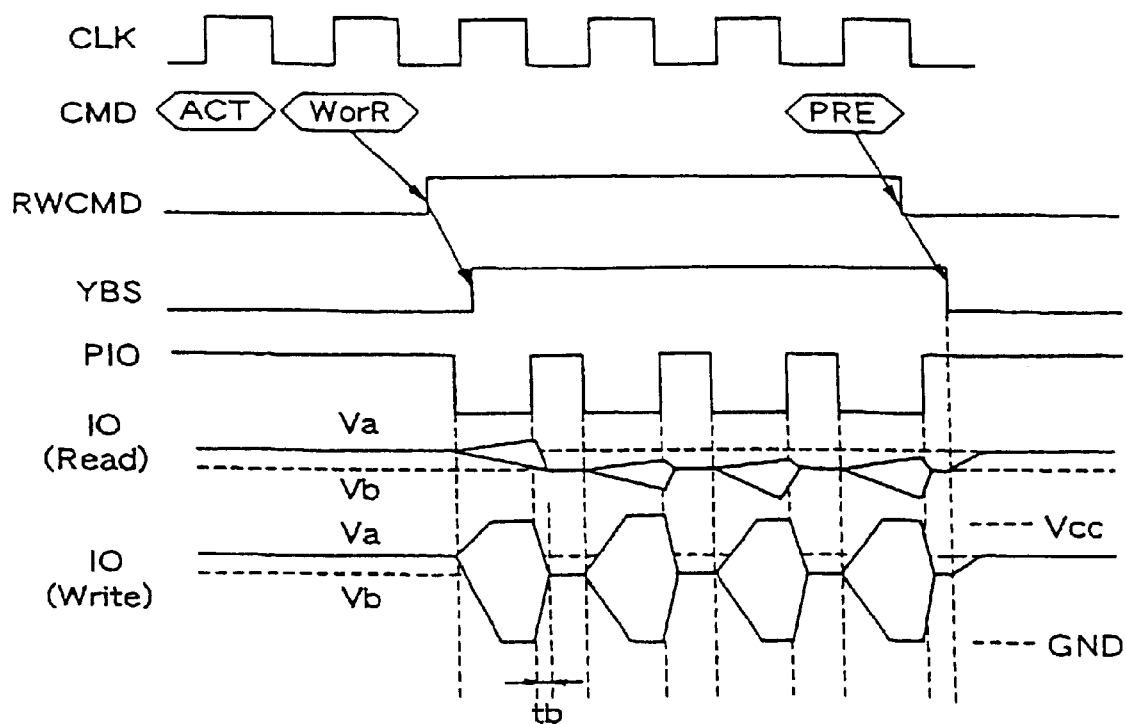
FIG. 11 is a timing chart showing operation of a semiconductor memory device according to the second embodiment of the present invention.

The operation of the second embodiment having the construction described above will now be explained. FIG. 11 is a timing chart showing operation of a semiconductor memory device according to the second embodiment of the invention. FIG. 11 shows IO (Read) and IO (Write) separately, but this is only to highlight the voltage change when each operation alone is carried out continuously, and the reading operation and writing operation may be combined. The operation described below, as in the first embodiment, is the operation after the memory cells among the memory cell array 1 which are to compose a row and in which data writing and reading are to be performed have been selected. That is, it is after the word line has been selected. The change of the signals RASB, RWCMD, WCMD, YBS and WE are common to the second embodiment and to the first and third embodiments, and therefore the changes in the signals WCMD and WE will be explained in detail below.

If the control signal /RAS is low, the control signal /CAS is high and the control signal /WE is high when the clock signal CLK rises, the command decoder 11 outputs an action command ACT.

if the control signal /RAS is high, the control signal /CAS is low and the control signal /WE is low when the clock signal CLK rises, the command decoder 11 outputs a write command W. If the control signal /RAS is high, the control signal /CAS is low and the control signal /WE is high when the clock signal CLK rises, the command decoder 11 outputs a read command R, and at a fixed delay after the command output, the read/write control signal RWCMD rises. At this timing, since the column-activating signal YBS is low, the transistors Tr6a and Tr6b are an OFF state while the transistors Tr6c and Tr6d are in an ON state, and the I/O lines IOT and ION are pre-charged to the voltage Va.

Next, when the pre-charge control signal PIO falls, the potentials of the I/O lines IOT and ION are dragged to the potentials of the bit line pairs BLT and BLN connected to the memory cells composing a column selected from each column selecting circuit 4. As a result, the potential of the I/O line IOT may increase and the potential of the I/O line ION may decrease. If the operation at this time is writing data to the selected memory cell, a written signal is amplified by the write amplifier 8. Therefore the increase or decrease of each potential is large, and the potential of the I/O line IOT converges to the internal power voltage Vcc while the potential of the I/O line ION converges to the ground potential GND. Also, even if the operation is reading data from the selected memory cell, as in the first embodiment, the difference between the potential of the bit line BLT and the potential of the I/O line ION is large and the potential of the I/O line ION falls considerably, thus resulting in a sufficient differential potential between the I/O lines IOT and ION.

The column-activating signal YBS rises during the first reading from the memory cell or writing to the memory cell. Thus, when the pre-charge control signal PIO subsequently rises, the transistors Tr6a and Tr6b are in an ON state while the transistors Tr6c and Tr6d are in an OFF state. As a result, the I/O lines IOT and ION are pre-charged to the voltage Vb (balance voltage Vbal). Consequently, even when the operation prior to pre-charging was a writing operation, the potentials of the I/O lines IOT and ION quickly reach the voltage Vb (balance voltage Vbal).

Next, data writing and reading are carried out alternately with pre-charging, in synchronization with the rise and fall of the pre-charge control signal PIO.

If the control signal /RAS is low, the control signal /CAS is high and the control signal /WE is low when the clock signal CLK rises, the command decoder 11 outputs a pre-charge command PRE, and the control signal RWCMD falls after a delay. The pre-charge control signal PIO is then fixed high in synchronization with the fall of the clock signal CLK, and read/write is complete. At a fixed delay after fall of the read/write control signal RWCMD, the column-activating signal YBS falls and the I/O lines IOT and ION are pre-charged to the voltage Va.

Thus, according to the second embodiment as well, the pre-charge level of the I/O lines IOT and ION just before the initial fall of the pre-charge control signal PIO is set to the voltage Va, and the pre-charge level of the I/O lines IOT and ION is changed to the voltage Vb, which is the balance level Vbal, from the initial start of operation until the subsequent rise of the pre-charge control signal PIO. Therefore, it is possible to shorten the time $t_{RCD}$ from the initial sensing by the sense amplifier 5 until the fall of the pre-charge control signal PIO, while also shortening the time tb to a balance during continuous writing to shorten one cycle $t_{ck}$ of the pre-charge control signal PIO. This can therefore be applied for acceleration of the clock signal CLK.

Figure 12:
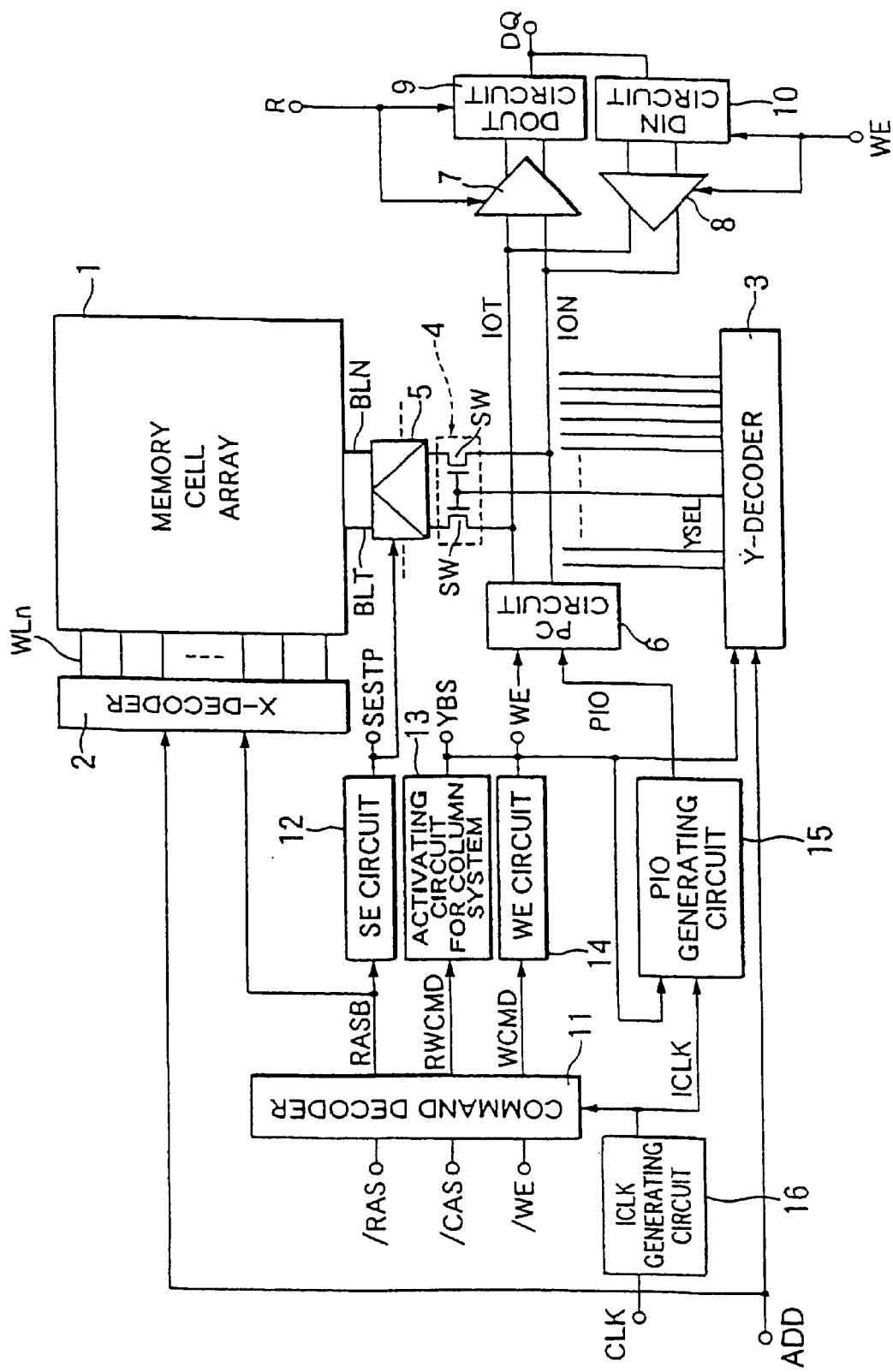
FIG. 12 is a block diagram of structure of a semiconductor memory device according to a third embodiment of the present invention.
Figure 13:
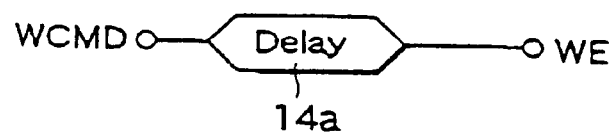
FIG. 13 is a block diagram of structure of a write enable (WE) circuit 14 according to the third embodiment.
Figure 14:
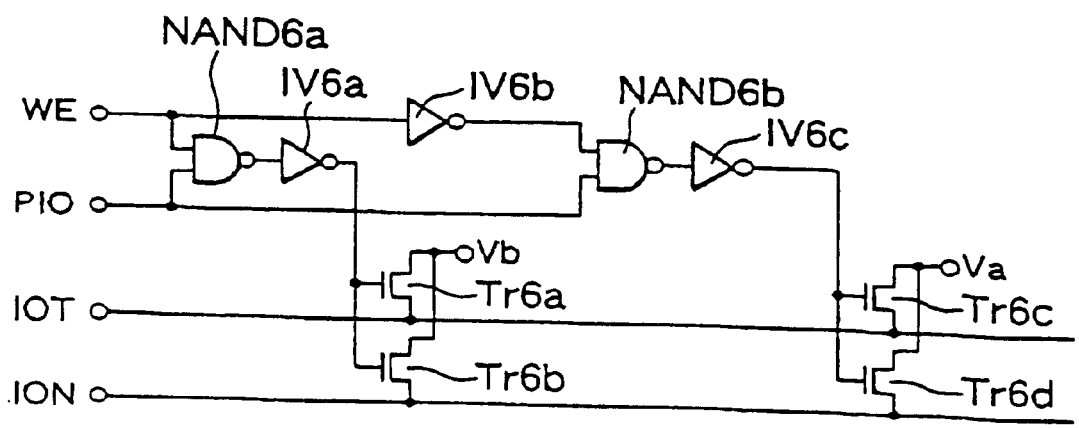
FIG. 14 is a block diagram showing a pre-charge (PC) circuit 6 and I/O lines IOT and ION according to the third embodiment.

A third embodiment of the present invention will now be explained. According to the third embodiment, the write enable signal WE is inputted to the pre-charge circuit 6 instead of the signals SESTP or YBS. FIG. 12 is a block diagram of structure of a semiconductor memory device according to a third embodiment of the invention. FIG. 13 is a block diagram of structure of a write enable (WE) circuit 14 according to the third embodiment. FIG. 14 is a block diagram showing a pre-charge circuit 6 and I/O lines IOT and ION according to the third embodiment.

According to the third embodiment, the write enable circuit 14 is provided with a delay circuit 14a whose input end is connected to an input terminal through which a write control signal WCMD is inputted. The output signal of the delay circuit 14a is the write enable signal WE.

As shown in FIG. 12 and FIG. 14, the pre-charge circuit 6 has the same structure as the first and second embodiments except that the write enable signal WE, and not the signal SESTP or YBS, is inputted.

The delay time by the delay circuit 14a is set so that the time from rise of the write control signal WCMD until rise of the write enable signal WE when the initial operation has been a writing operation is longer than the time from rise of the write control signal WCMD until the initial fall of the pre-charge control signal PIO, and shorter than the time until the next rise of the pre-charge control signal PIO.

Figure 15A:
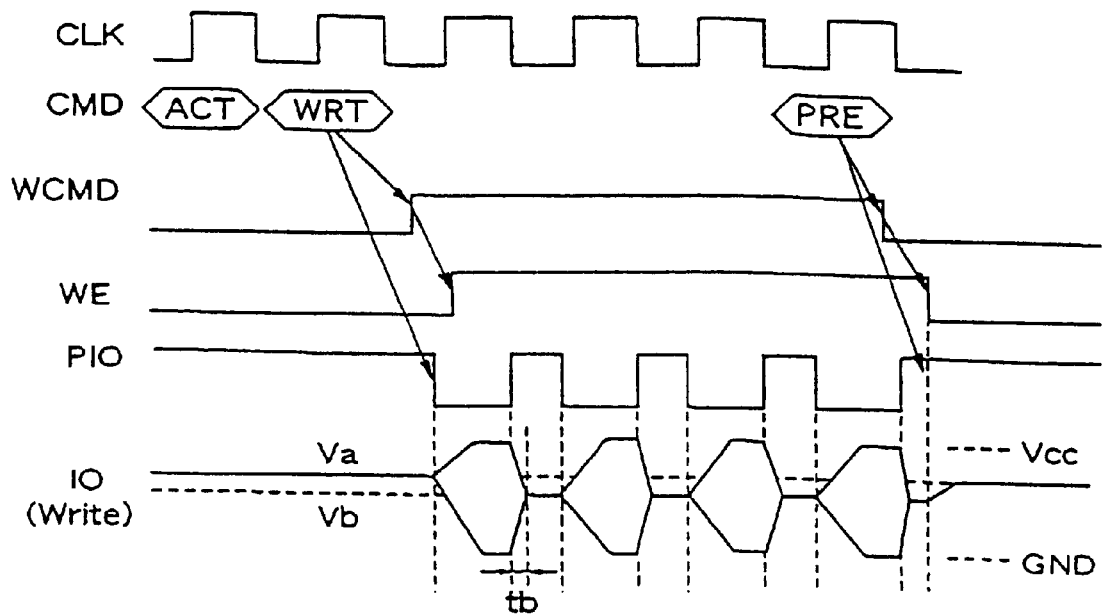
FIG. 15A and FIG. 15B are timing charts showing operation of semiconductor memory devices according to the third embodiment of the present invention.
Figure 15B:
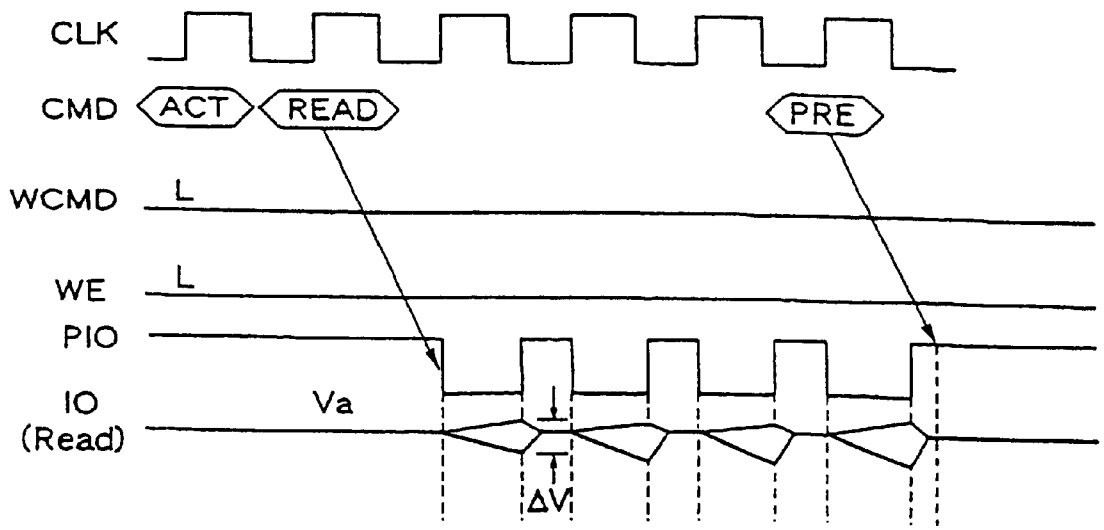

Operation of the third embodiment having the construction described above will now be explained. FIG. 15A and FIG. 15B show operation of semiconductor memory devices according to the third embodiment of the invention. FIG. 15A is a timing chart showing an operation in which data is continuously written, and FIG. 15B is a timing chart showing an operation in which data is continuously read. FIG. 15A and FIG. 15B show IO (Write) and IO (Read) separately, but this is only to highlight the voltage change when each operation alone is carried out continuously, and the reading operation and writing operation may be combined in actuality. As in the first and second embodiments, the operation described below is the operation performed after memory cells are selected among the memory cell array 1 which are to compose a row and in which data writing and reading are to be performed. That is, it is the operation carried out after selection of the word line.

For both continuously writing and continuously reading, if the control signal /RAS is low, the control signal /CAS is high and the control signal /WE is high when the clock signal CLK rises, the command decoder 11 outputs an action command ACT.

Next, in the case of continuously writing, as shown in FIG. 15A, if the control signal /RAS is high, the control signal /CAS is low and the control signal /WE is low when the clock signal CLK rises, the command decoder 11 outputs a write command WRT, and at a fixed delay after output of the write command WRT, the write control signal WCMD rises. At this timing, since the write enable signal WE is low, the transistors Tr6a and Tr6b are in an OFF state while the transistors Tr6c and Tr6d are in an ON state. Therefore, the I/O lines IOT and ION are pre-charged to the voltage Va.

Next, when the pre-charge control signal PIO falls, the potentials of the I/O lines IOT and ION are dragged to the potentials of the bit line pairs BLT and BLN connected to the memory cells composing a selected column from each column selecting circuit 4. As a result, the potential of the I/O line IOT may increase and the potential of the I/O line ION may decrease. Since a written signal is amplified by the write amplifier 8 at this time, the increase or decrease of each potential is large. Therefore, the potential of the I/O line IOT coverages to the internal power voltage Vcc while the potential of the I/O line ION converges to the ground potential GND.

The write enable signal WE rises during the first writing to the memory cell. Thus, when the pre-charge control signal PIO subsequently rises, the transistors Tr6a and Tr6b are in an ON state while the transistors Tr6c and Tr6d are in an OFF state. As a result, the I/O lines IOT and ION are pre-charged to the voltage Vb (balance voltage Vbal). Consequently, even when the operation prior to pre-charging was a writing operation, the potentials of the I/O lines IOT and ION quickly reach the voltage Vb (balance voltage Vbal).

Next, data reading and pre-charging are carried out alternatively with pre-charging, in synchronization with the rise and fall of the pre-charge control signal PIO.

If the control signal /RAS is low, the control signal /CAS is high and the control signal /WE is low when the clock signal CLK rises, the command decoder 11 outputs a pre-charge command PRE, and the write control signal WCMD falls after a delay. The pre-charge control signal PIO is then fixed high in synchronization with the fall of the clock signal CLK, and continuously writing is complete. At a fixed delay after fall of the write control signal WCMD, the write enable signal WE falls and the I/O lines IOT and ION are pre-charged to the voltage Va.

On the other hand, in the case of continuously reading, as shown in FIG. 15B, if the control signal /RAS is high, the control signal /CAS is low and the control signal /WE is high when the clock signal CLK rises, the command decoder 11 outputs a read command READ. At this point, since the write enable signal WE is low, the transistors Tr6a and Tr6b are in an OFF state while the transistors Tr6c and Tr6d are in an ON state, and the I/O lines IOT and ION are pre-charged to the voltage Va.

Next, when the pre-charge control signal PIO falls, the potentials of the I/O lines IOT and ION are dragged to the potentials of the bit line pairs BLT and BLN connected to the memory cells composing a selected column from each column selecting circuit 4. As a result, the potential of the I/O line IOT may increase and the potential of the I/O line ION may decrease. Here, as in the first and second embodiments, the difference between the potential of the bit line BLN and the potential of the I/O line ION is large and the potential of the I/O line ION falls considerably, thus resulting in a sufficient differential potential between the I/O lines IOT and ION.

Data writing and pre-charging are then carried out alternately in synchronization with the rise and fall of the pre-charge control signal PIO. Since there is no rise in the write enable signal WE during this time, the pre-charge level is constantly at the voltage Va.

If the control signal /RAS is low, the control signal /CAS is high and the control signal /WE is low when the clock signal CLK rises, the command decoder 11 outputs a pre-charge command PRE, the pre-charge control signal PIO is fixed high in synchronization with the fall of the clock signal CLK, and continuously reading is complete. The I/O lines IOT and ION are pre-charged to the voltage Va.

Thus, according to the third embodiment as well, the pre-charge level of the I/O lines IOT and ION just before the initial fall of the pre-charge control signal PIO is at the voltage Va, and the pre-charge level of the I/O lines IOT and ION is changed to the voltage Vb, which is the balance level Vbal, from the initial start of the writing operation until the subsequent rise of the pre-charge control signal PIO. Therefore, it is possible to shorten the time $t_{RCD}$ from the initial sensing by the sense amplifier 5 until the fall of the pre-charge control signal PIO, while also shortening the time tb to a balance during continuously writing to shorten one cycle $t_{ck}$ of the pre-charge control signal PIO. This can therefore be applied for acceleration of the clock signal CLK.

In the first to third embodiments, the pre-charge level after writing operation is the balance level during writing, but this is not intended to be a restriction on the present invention, and the pre-charge level after writing operation may also be half the voltage supplied to the internal circuit.

These embodiments have been explained for operation with an increase in the potential of the I/O line IOT and a decrease in the potential of the I/O line ION, but the I/O lines with rising and falling potential may sometimes be switched depending on the written data and the read data. In such cases as well, the two are in a complementary relationship.

What is claimed is:

1. A semiconductor memory device comprising:
   a memory cell array;
   a plurality of bit line pairs to which a plurality of memory cells are commonly connected, said plurality of memory cells composing a column in said memory cell array;
   an I/O line pair to which said plurality of bit line paris are commonly connected; and
   a pre-charge circuit which pre-charges said I/O line pair, said pre-charge circuit comprising a selection circuit which selects a pre-charge level of said I/O line pair from among a plurality of voltage levels.

2. The semicondutor memory device according to claim 1, wherein said selection circuit sets a pre-charge level after a plurality of memory cells are selected up until the initial writing or reading is conducted to a first level, said plurality of memory cells composing a row in said memory cell array and data writing or reading being to be performed in said plurality of memory cells, and sets a pre-charge level after completion of data writing up until the next data writing or reading to a second level.

3. The semiconductor memory device according to claim 2, wherein a value obtained by the expression |Va-Vbal| is large than a value obtained by the expression |Vb-Vbal|, where Va is said first level, Vb is said second level and Vbal is a balance of a differential potential between said I/O line pair a the time of data writing.

4. The semiconductor memory device according to claim 3, wherein said first level Va is equivalent to said balance potential Vbal.

5. The semiconductor memory device according to claim 2, wherein said second level is half a a voltage supplied to an internal claim of a sense amplifier.

6. The semiconductor memory device according to claim 2, wherein said first level is a voltage obtained by stepping down a voltage supplied to an internal circuit of a sense amplifier.

7. The semiconductor memory device according to claim 2, wherein said selection circuit sets said pre-charge level to said second level after completion of the second or later data writing or reading after said plurality of memory cells are selected.

8. The semiconductor memory device according to claim 3, wherein said selection circuit sets said pre-charge level to said second level after completion of the second or later data writing or reading after said plurality of memory cells are selected.

9. The semiconductor memory device according to claim 4, wherein said selection circuit sets said pre-charge level to said second level after completion of the second or later data writing or reading after said plurality of memory cells, are selected.

10. The semiconductor memory device according to claim 5, wherein said selection circuit sets said pre-charge level to said second level after completion of the second or later data writing or reading after said plurality of memory cells are selected.

11. The semiconductor memory device according to claim 6, wherein said selection circuit sets said pre-charge level to said second layer after completion of the second or later data writing or reading after said plurality of memory cells are selected.

* * * * *